(12) United States Patent
Goldman et al.

(10) Patent No.: US 6,326,859 B1
(45) Date of Patent: Dec. 4, 2001

(54) OSCILLATOR CIRCUIT HAVING TRIMMABLE CAPACITOR ARRAY RECEIVING A REFERENCE CURRENT

(75) Inventors: Richard Goldman; Robin Wilson, both of Cirencester (GB)

(73) Assignee: Telefonaktiebolaget LM Ericsson (publ), Stockholm (SE)

( * ) Notice: Subject to any disclaimer, the term of this patent is extended or adjusted under 35 U.S.C. 154(b) by 0 days.

(21) Appl. No.: 09/609,061

(22) Filed: Jun. 30, 2000

(30) Foreign Application Priority Data

Jul. 1, 1999 (GB) .................................... 9915421

(51) Int. Cl.[7] ................ H03K 3/0231; H03K 3/011; H03K 3/03
(52) U.S. Cl. ................................. 331/143; 331/111
(58) Field of Search ....................... 331/111, 143

(56) References Cited

U.S. PATENT DOCUMENTS

| | | | |
|---|---|---|---|
| 3,878,484 | 4/1975 | Hekimian | 331/143 |
| 4,983,931 | 1/1991 | Nakano | 331/111 |
| 5,070,311 | 12/1991 | Nicolai | 331/111 |
| 5,128,634 | 7/1992 | Pigott | 331/143 |
| 5,155,452 | 10/1992 | Ueda et al. | 331/111 |
| 5,270,670 | 12/1993 | Bladh | 331/74 |
| 5,418,502 | 5/1995 | Ma et al. | 331/111 |
| 5,444,421 | 8/1995 | Carroll et al. | 331/111 |
| 5,565,819 | 10/1996 | Cooper | 331/111 |
| 5,670,915 | 9/1997 | Cooper et al. | 331/111 |
| 5,796,312 | 8/1998 | Hull et al. | 331/44 |
| 5,859,571 | 1/1999 | Lee et al. | 331/53 |

FOREIGN PATENT DOCUMENTS

| | | |
|---|---|---|
| 142171 | 5/1985 | (EP) . |
| 308540 | 3/1989 | (EP) . |
| 0407269 | 1/1991 | (EP) . |
| 0578020 | 1/1994 | (EP) . |
| 2189113 | 10/1987 | (GB) . |
| WO9820609 | 5/1998 | (WO) . |

OTHER PUBLICATIONS

Modern Electronic Circuits Reference Manual, McGraw Hill, 1980, p. 423, See Lower Circuit.

Cheng et al., "A low–frequency CMOS triangle wave generator", IEEE Journal of Solid–State Circuits., vol. sc–20, No. 2, Apr. 1, 1985, pp. 649–652, XP002148814.

*Primary Examiner*—Siegfried H. Grimm
(74) *Attorney, Agent, or Firm*—Burns, Doana, Swecker & Mathis, L.L.P.

(57) ABSTRACT

An oscillator circuit includes a current generator which supplies current to input terminals of capacitors in a trimmable capacitor array. The input terminals of the capacitors are held at a relatively constant voltage, and thus all of the current from the current generator passes through the desired capacitors of the capacitor array, thus minimizing the effect of parasitic capacitance.

4 Claims, 4 Drawing Sheets

OSCILLATOR CIRCUIT HAVING TRIMMABLE CAPACITOR ARRAY RECEIVING A REFERENCE CURRENT

This application claims priority under 35 U.S.C. §§119 and/or 365 to 9915421.3 filed in Great Britain on Jul. 1, 1999; the entire content of which is hereby incorporated by reference.

1. Technical Field

This invention relates to an oscillator circuit, for example for generating a clock signal in an integrated circuit.

2. Background of the Invention

Oscillator circuits are commonly used in integrated circuits to provide clock signals. The frequency of the resulting clock signal depends on parameters of the oscillator circuit. In an integrated circuit, it is typically not possible to manufacture the oscillator circuit components with sufficient precision to provide a clock frequency with a desired accuracy.

Therefore, it is known to manufacture an oscillator circuit whose frequency is trimmable. That is, the frequency is adjustable, after manufacture, by means of an input signal, for example a multi-bit digital signal. Thus, the frequency can be brought accurately to the desired value.

U.S. Pat. No. 5,859,571 discloses a frequency trimmable oscillator, in which a current generator provides an output current, and also generates two threshold voltages. The current is switched into a delay unit, which includes two arrays of capacitors, one for providing coarse trimming of the output frequency, and one for providing fine trimming. The voltage on the capacitors is compared with the two threshold voltages, and the results of the comparisons are used to set and reset a flip-flop, with the time taken for each such cycle being the period of the output clock signal, such that the frequency is dependent on the value of the trimmed capacitance and is hence adjustable as desired.

However, as mentioned above, this circuit requires two arrays of capacitors. Moreover, each capacitor has an associated parasitic capacitance. It is an inherent feature of integrated circuit capacitors that the value of the parasitic capacitance is not as well controlled as the value of the intended capacitance. Therefore, while the output frequency of the oscillator should desirably vary linearly with the intended trimmed capacitance value, in practice this can only be achieved to a limited extent.

SUMMARY OF THE INVENTION

In accordance with a preferred aspect of the invention, an oscillator circuit includes a current generator producing a current which is trimmable by means of a resistor array, and thus includes only a single capacitor array.

In accordance with a further preferred aspect of the invention, an oscillator circuit includes a current generator which supplies current to input terminals of capacitors in a trimmable capacitor array. The input terminals of the capacitors are held at a relatively constant voltage, and thus all of the current from the current generator passes through the desired capacitors of the capacitor array, thus minimizing the effect of parasitic capacitance.

DETAILED DESCRIPTION OF PREFERRED EMBODIMENTS

Figure 1:
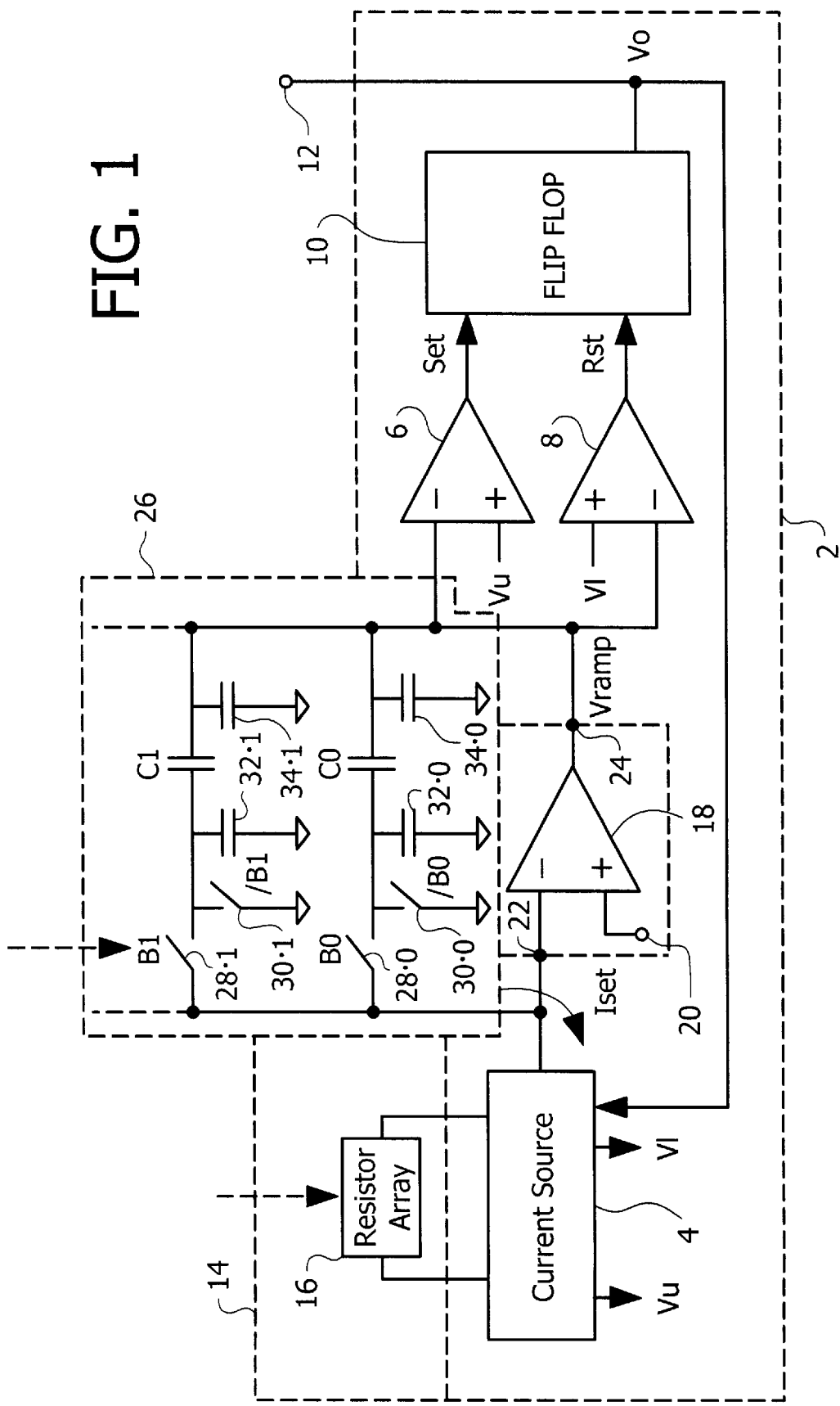
FIG. 1 is a block diagram of an oscillator circuit in accordance with the invention.

FIG. 1 shows an oscillator circuit in accordance with aspects of the present invention. The oscillator circuit of FIG. 1 includes a control circuit 2, which includes a current source 4. The current source 4 generates a current of magnitude Iset, which can be forced to flow out of or into the current source 4. The current source 4 further generates first and second threshold voltages Vu, Vl, which are supplied as inputs to respective comparators 6, 8. The other inputs to these comparators 6, 8 are each supplied with a voltage of magnitude Vramp. The outputs of the comparators 6, 8 are connected to the Set and Reset terminals respectively of a flip-flop 10, and the output of the flip-flop 10 is fed back to the current source 4, and is also fed to a circuit output 12 as an output clock signal.

A variable resistance circuit 14, including a resistor array 16, is connected to the current source 4, to alter the magnitude Iset of the current output therefrom.

An operational amplifier 18 has its non-inverting input terminal 20 connected to a fixed reference voltage Vref, which may also be provided by the control circuit 2 if desired. The inverting input terminal 22 of the operational amplifier 20 is connected to an output of the current source 4. The output terminal 24 of the operational amplifier 18 provides an amplifier output voltage Vramp which, as mentioned above, is supplied to the control circuit 2 as an input to each of the comparators 6, 8. The operational amplifier 18 is generally conventional, and will not be described further herein.

A capacitor array 26 is connected between the operational amplifier output terminal 24 and inverting input terminal 22, and thus forms a feedback loop around the amplifier.

Since the voltage at the operational amplifier non-inverting input 20 is held constant relative to the supply voltage, the voltage at the operational amplifier inverting input 22 is also held relatively constant.

The capacitor array includes a fixed capacitance (not shown in FIG. 1) and a plurality of capacitors, which can be switched into or out of the circuit by means of a multiple bit digital signal. In a preferred embodiment, there are nine such capacitors, but FIG. 1 shows only two capacitors C0, C1, for clarity. Each capacitor C0, C1, . . . has a first terminal connected to the amplifier inverting input terminal 22 through a first respective switch 28.0, 28.1, . . . , or is connected to ground through a second respective switch 30.0, 30.1, . . . . The switches are controlled by control bits B0, B1, . . . , such that, when a control bit is high, the respective first switch is closed, and, when a control bit is low, the respective second switch is closed. Each capacitor C0, C1, . . . further has a second terminal connected to the operational amplifier output terminal 24.

It is relevant that each capacitor C0, C1, . . . in the array 26 has an associated parasitic capacitance. Specifically, as shown in FIG. 1, there is a parasitic capacitance 32.0, 32.1, . . . between the first capacitor terminal and the substrate, and a parasitic capacitance 34.0, 34.1, . . . between the second capacitor terminal and substrate.

Figure 2:
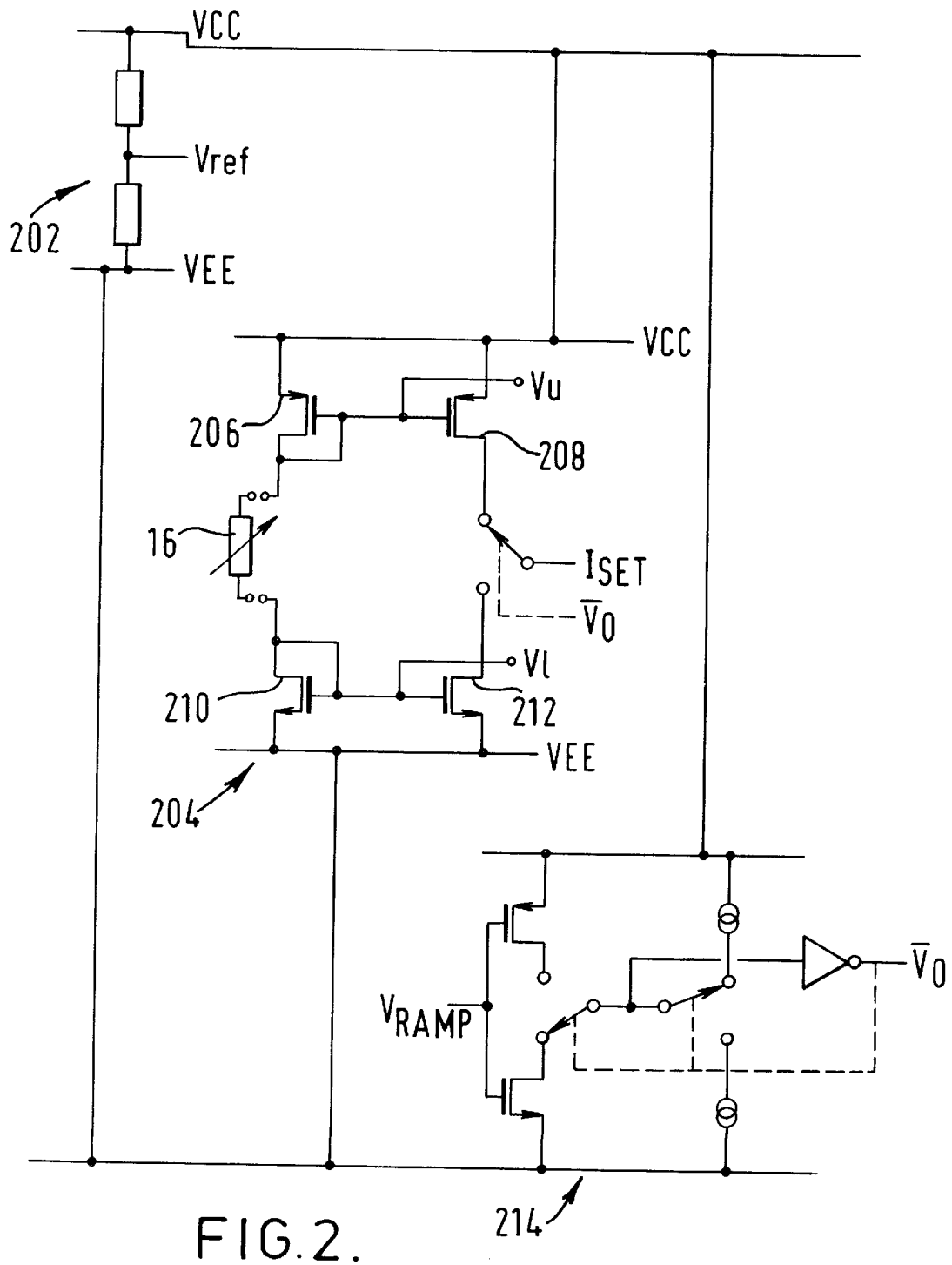
FIG. 2 is a schematic circuit diagram of a first sub-circuit forming part of the circuit of FIG. 1.

FIG. 2 is a schematic circuit diagram of the control circuit 2 of FIG. 1. The control circuit includes a voltage divider 202 which provides the reference voltage Vref to the non-inverting input terminal of the operational amplifier 18. The control circuit also includes a current source 204, which has connections for the variable resistor array 16, and is controlled by the inverted circuit output voltage to produce the current output Iset. The first threshold voltage Vu is the gate voltage of PMOS transistors 206, 208, and the lower threshold voltage Vl is the gate voltage of NMOS transistors 210, 212. The control circuit 2 also includes a sub-unit 214 with comparators and a flip-flop, producing the inverted circuit output voltage.

Figure 3:
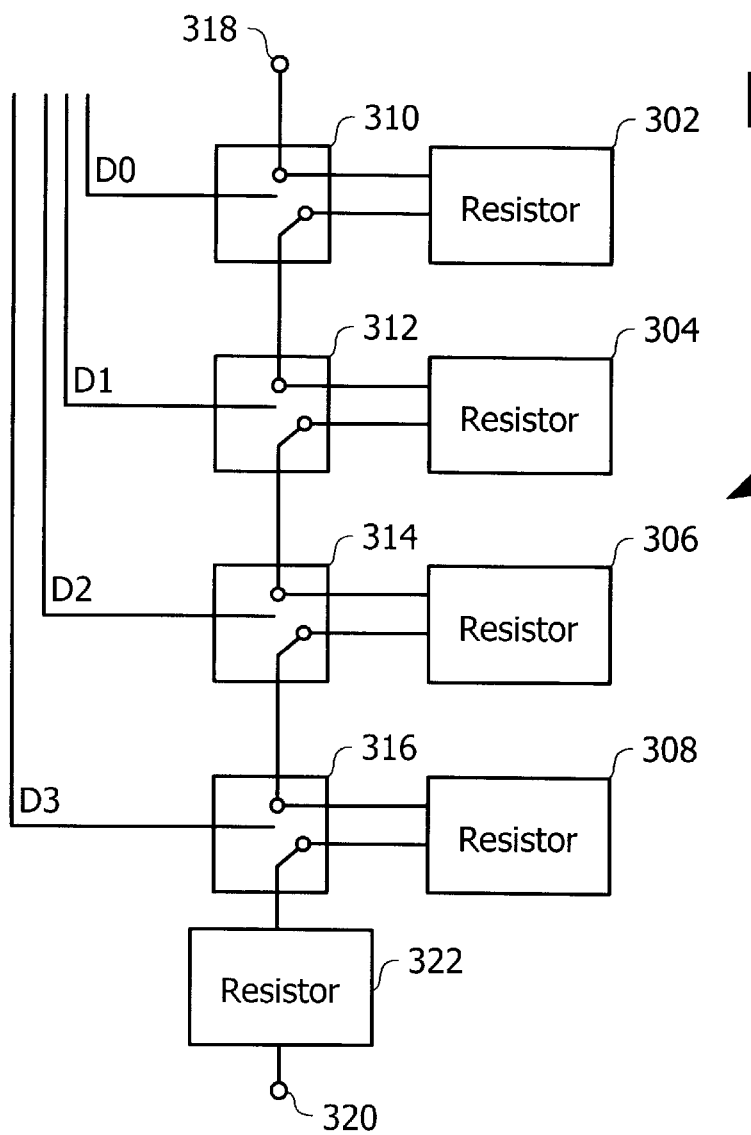
FIG. 3 is a schematic circuit diagram of a second sub-circuit forming part of the circuit of FIG. 1.

FIG. 3 is a schematic circuit diagram of the variable resistor-array 14 of FIG. 1. The resistor array 14 includes four resistors 302, 304, 306, 308, and four CMOS switches 310, 312, 314, 316, which are of generally known type. The switches are connected in series with a fifth resistor 322 between terminals 318, 320, which are themselves connected to the current source 4. The switches 310, 312, 314, 316 are controlled by the binary signals D0, D1, D2, D3 respectively. When the respective binary value is low, the switch is closed, and when the respective binary value is high, the switch is open and the corresponding resistor is switched into the circuit.

In the preferred embodiment, the resistor 302 has a value of 21 kΩ, resistor 304 has a value of 2×21=42 kΩ, resistor 306 has a value of 4×21=84 kΩ, resistor 308 has a value of 8×21=168 kΩ, and resistor 322 has a value of 15×21=315 kΩ. The resistors can advantageously be formed from blocks of matched resistors of value 21 kΩ. Thus, by switching the resistors 302, 304, 306, 308 into or out of the circuit by means of the control bits D0–3, the resistance value of the resistor array 14 can be varied between 315 kΩ, if the switches are all closed, and 630 kΩ, if the switches are all open.

Figure 4:
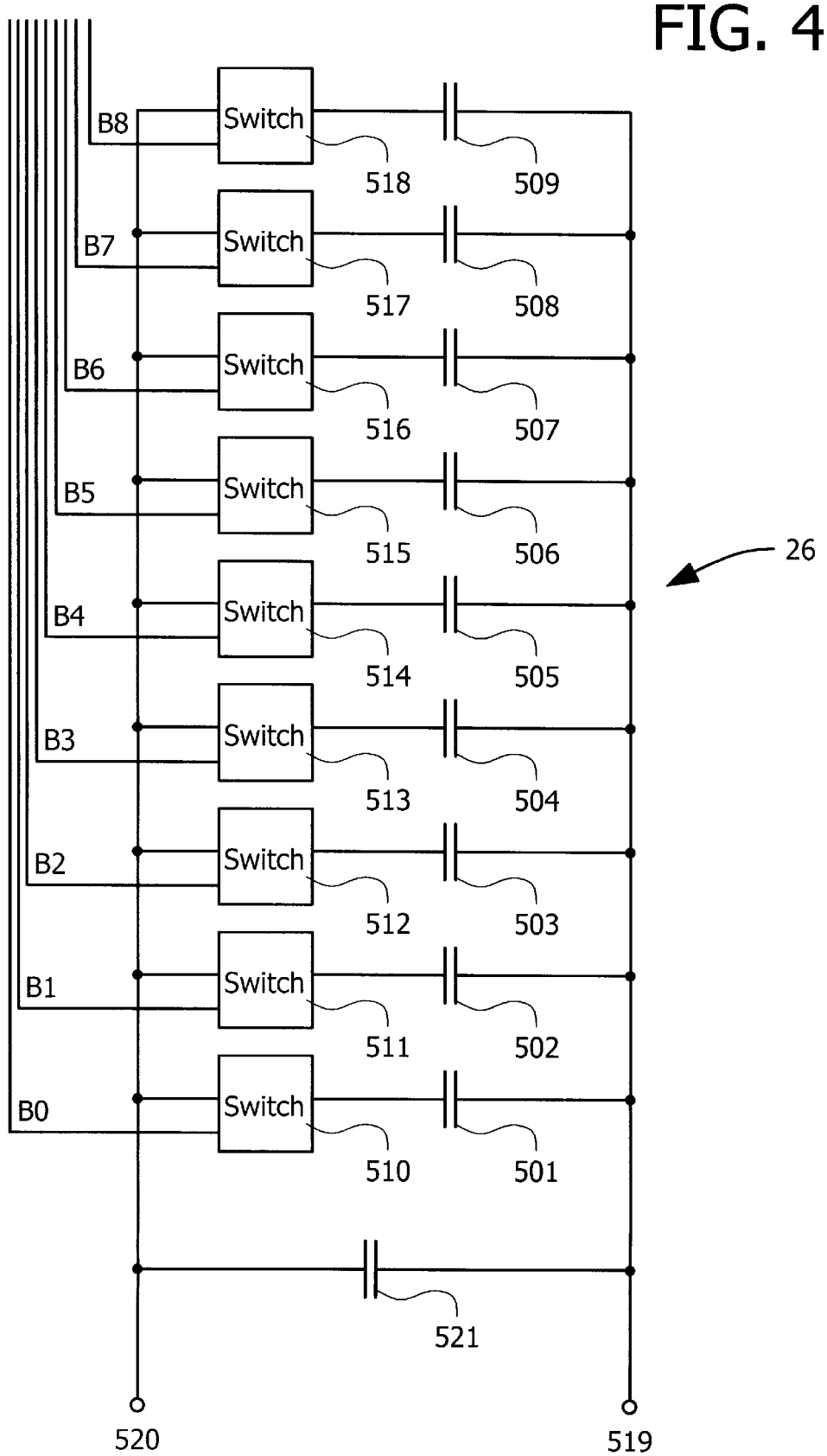
FIG. 4 is a schematic circuit diagram of a third sub-circuit forming part of the circuit of FIG. 1.

FIG. 4 is a schematic circuit diagram of the variable capacitor array 26 of FIG. 1. The capacitor array 26 includes nine capacitors 501, ..., 509, each connected in series with a respective switch 510, ..., 518 between terminals 519, 520 in the feedback loop of the operational amplifier 18. Also connected in parallel with the nine capacitors 501, ..., 509 is a capacitor 521. Each of the switches 510, ..., 518 is of the type shown in FIG. 1, and is controlled by a respective binary digit B0, ..., B8. When the respective binary value is low, the corresponding capacitor is switched into the circuit, and when the corresponding binary value is high, the switch is open and the corresponding capacitor is switched out of the circuit.

In the preferred embodiment, the capacitor 510 has a value of 0.152 pF, capacitor 511 has a value of 2×0.152 pF, capacitor 512 has a value of 4×0.152 pF, capacitor 513 has a value of 8×0.152 pF, capacitor 514 has a value of 16×0.152 pF, capacitor 515 has a value of 32×0.152 pF, capacitor 516 has a value of 64×0.152 pF, capacitor 517 has a value of 128×0.152 pF, and capacitor 518 has a value of 256×0.152 pF, while capacitor 521 has a value of 305.5 pF. These capacitors can advantageously be formed from blocks of matched capacitors of value 0.152 pF, or 8×0.152 pF, or 64×0.152 pF.

Thus, by switching the capacitors 510, ..., 518 into or out of the circuit by means of the control bits B0–8, the capacitance value of the capacitor array 26 can be varied between 305.5 pF, if all of the binary values B0–B9 are high and the corresponding capacitors are all switched out of the circuit, and 305.5 pF +511×0.152 pF, if all of the binary values are low and the corresponding capacitors are all switched into the circuit. Integrated Circuit capacitors can have good matching, which allows a highly linear relationship between the value of the binary word B0–B9 and the trimmed capacitance value.

Thus, in operation of the circuit of FIGS. 1–4, the current source 4 produces a current Iset which is a function of the positive supply voltage, and is inversely proportional to the coarse trimmed resistance value of the resistor array 16. The current source 4 can act as a source or sink, and the direction of the current depends on the sign of the signal Vo at output 12 which is fed back to the current source. When this signal is high, current flows into the current source 4 from the capacitor array 26, as shown by the arrow in FIG. 1. When this signal is low, current flows from the current source 4 into the capacitor array 26.

The current Iset, by flowing through the capacitor array 26, causes the output voltage Vramp of the operational amplifier 18 to increase or decrease linearly.

Figure 5:
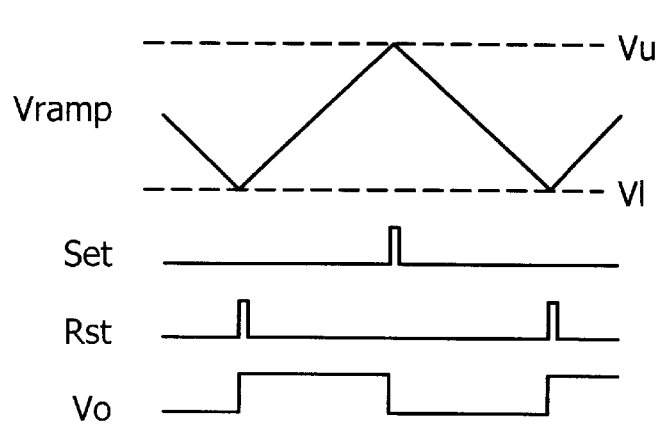
FIG. 5 is a timing diagram for explaining the operation of the circuit of FIG. 1.

Thus, as shown in FIG. 5, when Vo is low, Vramp falls until it reaches the lower threshold Vl, at which time the comparator 8 sends a pulse to the Reset input of the flip-flop 10. The output Vo then goes high, and Vramp begins to rise. Vramp continues to rise until it reaches the upper threshold Vu, at which time the comparator 6 sends a pulse to the Set input of the flip-flop 10. Thus, the circuit produces an oscillating output Vo, as shown in FIG. 5.

As mentioned above, the threshold voltages Vl, Vu are set by the current source 4, and they are affected by changes in the supply voltage in the same way as the current Iset.

The frequency of oscillation Fosc is the inverse of the period of one cycle. The period of one cycle is twice the time Δt taken for the operational amplifier output voltage Vramp to increase from Vl to Vu, or fall from Vu to Vl. Thus, if (Vu−Vl)=ΔV, and the total selected capacitance of the array 26 is Ct, then :

$$Fosc = \frac{1}{2\Delta t} = \frac{Iset}{Ct \cdot \Delta V}$$

Typically, the upper and lower thresholds Vu, Vl, and the current Iset might be related to the supply voltage Vdd and resistance Rset of the resistor array by equations such as:

$Vu = Vdd - Vx1$ $Vl = Vx2$ $Iset = (Vdd - Vx1 - Vx2)/Rset$ where Vx1 and Vx2 are unknown voltages.
This gives:

$$Fosc = \frac{Vdd - Vx1 - Vx2}{Ct \cdot Rset(Vdd - Vx1 - Vx2)} = \frac{1}{Ct \cdot Rset}$$

Thus, the frequency of oscillation is controlled by the trimmed values of resistance and capacitance, but is independent of fluctuations in the supply voltage Vdd.

As mentioned previously, the capacitors C0–C8 have parasitic capacitances associated therewith. However, the circuit of the present invention minimizes any problems caused thereby. Specifically, referring to FIG. 1, the operational amplifier 18 has a high gain, and the non-inverting input terminal is held at a constant voltage. Thus, the operational amplifier acts to keep the voltages at its two input terminals at the same level, and the voltage at the inverting input is kept generally constant. As a result, the voltages across the parasitic capacitances 32.0, 32.1 etc. stay generally constant, and all of the current Iset passes through the relevant capacitor C0, C1 etc, rather than through the parasitic capacitance. While current does pass through the parasitic capacitances 34.0, 34.1 etc, this is derived from the operational amplifier 18, rather than from the current Iset.

As a result, the oscillator frequency Fosc has an accurate and linear relationship to the total value of the intended capacitance Ct.

There is thus described an oscillator circuit which can be used in an integrated circuit and produces a output frequency which can be accurately controlled.

What is claimed is:

1. An oscillator circuit, comprising:

a current supply circuit, for generating a reference current;

a capacitor array, comprising a plurality of capacitors and switches for switching the capacitors into and out of the circuit to control a total trimming capacitance value; and a timing circuit, connected to the capacitor array to receive a voltage across the capacitor array as an input thereto;

wherein the reference current is supplied to the capacitor array at respective first nodes of the plurality of capacitors to charge or discharge the capacitors switched into the circuit, and the timing circuit produces an output signal with a period which depends on the time taken for the voltage across the capacitor array to reach one or more voltage threshold values;

further comprising:

an operational amplifier, having a first input terminal connected to a reference voltage, a second input terminal connected to the respective first nodes of the capacitors in the capacitor array, and an output terminal connected between the capacitor array and the timing circuit, such that the capacitor array forms a feedback loop around the operational amplifier, and such that the respective first nodes of the capacitors are held at a relatively constant voltage.

2. An oscillator circuit as claimed in claim 1, further comprising a resistor array, comprising a plurality of resistors and switches for switching the resistors into and out of the circuit to control a total trimming resistance value, the current source generating the reference current as a function of the trimming resistance value.

3. An oscillator circuit as claimed in claim 2, wherein the resistor array provides coarse trimming, and the capacitor array provides fine trimming.

4. An oscillator circuit as claimed in claim 1, wherein the reference current, and the or each voltage threshold value, are provided from a circuit supply voltage, such that any variations therein produce substantially no overall effect on the period of the output signal.

* * * * *